(12) United States Patent
Khalil (10) Patent No.: US 7,034,623 B2
(45) Date of Patent: Apr. 25, 2006

(54) VOLTAGE CONTROLLED OSCILLATOR APPARATUS, METHOD, AND SYSTEM

(75) Inventor: Waleed Khalil, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 115 days.

(21) Appl. No.: 10/729,629

(22) Filed: Dec. 5, 2003

(65) Prior Publication Data

US 2005/0122180 A1  Jun. 9, 2005

(51) Int. Cl.
*H03B 27/00* (2006.01)
(52) U.S. Cl. ............................ 331/34; 331/45; 331/48; 331/117 R; 331/117 FE; 331/167

(58) Field of Classification Search .................. 331/34, 331/45, 46, 48, 50, 56, 117 R, 117 FE, 167; 330/252, 253, 254, 277, 295
See application file for complete search history.

(56) References Cited

U.S. PATENT DOCUMENTS 6,650,195 B1 * 11/2003 Brunn et al. ............ 331/177 V

* cited by examiner

*Primary Examiner*—Michael B. Shingleton
(74) *Attorney, Agent, or Firm*—LeMoine Patent Services, PLLC (57) ABSTRACT

A voltage controlled oscillator includes two gain stages to split the bias current and reduce phase noise.

27 Claims, 7 Drawing Sheets

VOLTAGE CONTROLLED OSCILLATOR APPARATUS, METHOD, AND SYSTEM

FIELD

The present invention relates generally to oscillator circuits, and more specifically to voltage controlled oscillator circuits.

BACKGROUND

Voltage controlled oscillators (VCOs) provide a VCO output signal having a frequency that varies based on a control signal. Voltage controlled oscillators may exhibit "phase noise," which is a measure of how much the VCO output signal deviates from a pure sine wave at a single frequency.

DESCRIPTION OF EMBODIMENTS

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Figure 1:
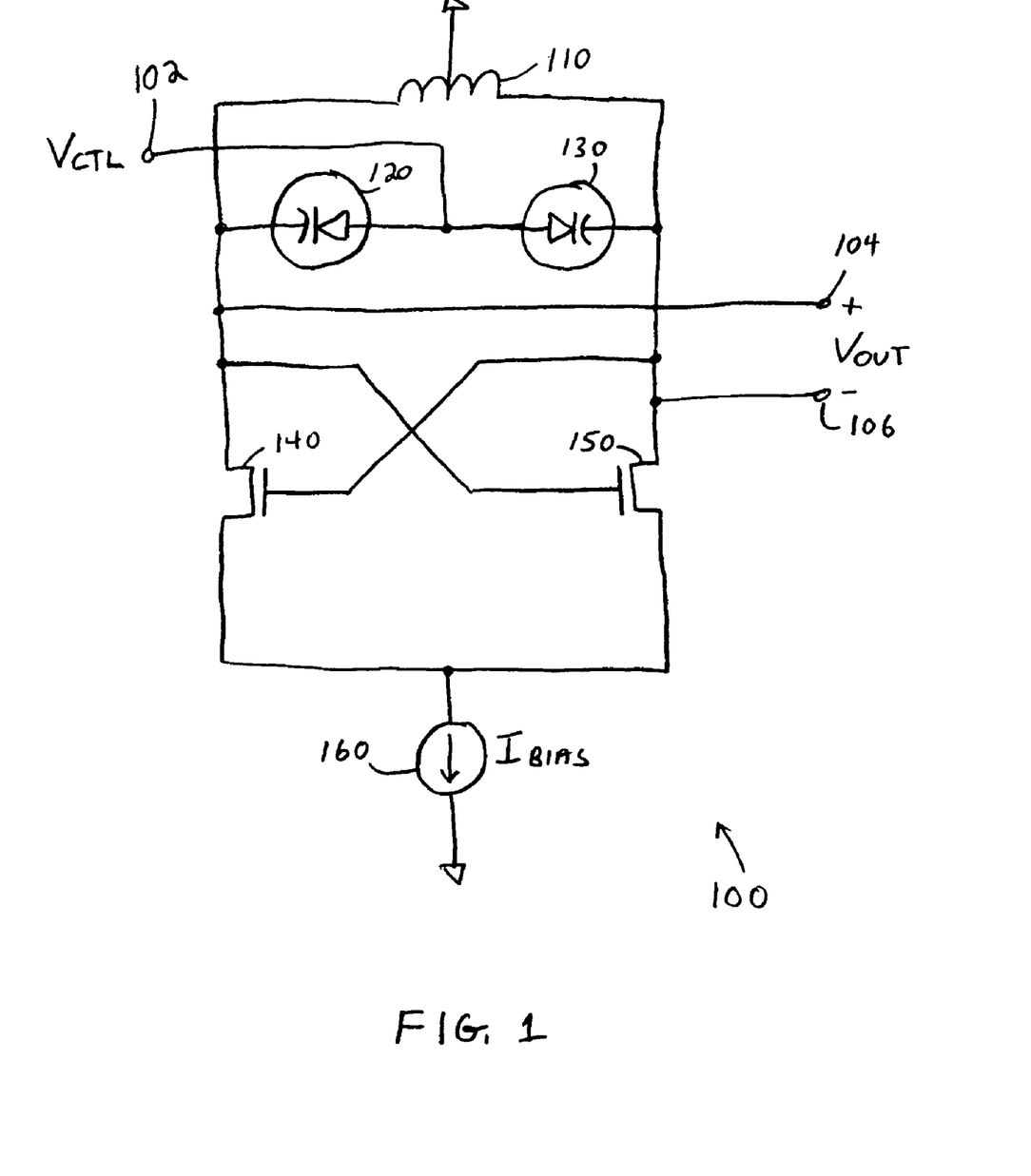
FIG. 1 shows a diagram of a voltage controlled oscillator having isolated gate transistors.

FIG. 1 shows a diagram of a voltage controlled oscillator (VCO) having isolated gate transistors. Voltage controlled oscillator 100 includes inductor 110, varactors 120 and 130, isolated gate transistors 140 and 150, and current source 160. Inductor 110 and varactors 120 and 130 form an LC tank circuit. Isolated gate transistors 140 and 150 are shown as N-type metal oxide semiconductor field effect transistors (MOSFETs) having source nodes coupled in common, and each has a gate node coupled to the other's drain node. This configuration of transistors is referred to herein as a "cross-coupled" pair of transistors.

Voltage controlled oscillator 100 provides an oscillating signal ($V_{OUT}$) on nodes 104 and 106 that varies in frequency as the control voltage ($V_{CTL}$) on input node 102 changes. The frequency of $V_{OUT}$ is set generally by the resonant frequency of the tank circuit, which is set by the inductance of inductor 110 and the capacitance of varactors 120 and 130, as well as other distributed reactive and resistive elements throughout VCO 100. As the control voltage $V_{CTL}$ is varied on input node 102, the capacitance of varactors 120 and 130 changes, the resonant frequency of the tank circuit changes, and the frequency of $V_{OUT}$ changes.

Voltage controlled oscillator 100 also includes current source 160. Current source 160 sources a bias current $I_{BIAS}$ that is provided to cross-coupled transistors 140 and 150. Values for $I_{BIAS}$ and rationale for setting $I_{BIAS}$ are described below.

Figure 2:
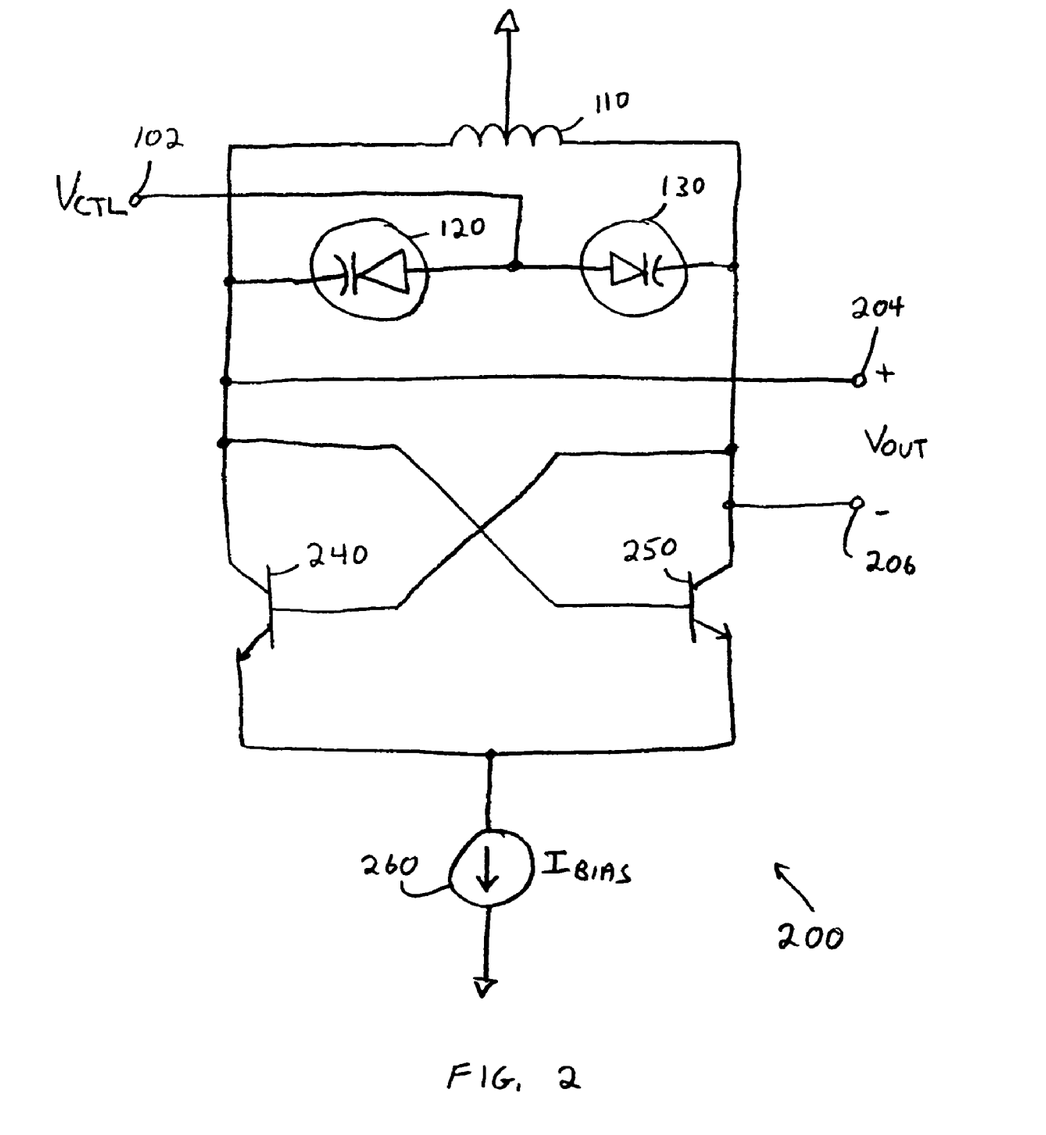
FIG. 2 shows a diagram of a voltage controlled oscillator having bipolar junction transistors.

FIG. 2 shows a diagram of a voltage controlled oscillator having bipolar junction transistors (BJTs). Voltage controlled oscillator 200 includes the same LC tank circuit shown in FIG. 1, but includes cross-coupled bipolar junction transistors 240 and 250 in place of isolated gate transistors 140 and 150. Voltage controlled oscillator 200 receives the control voltage ($V_{CTL}$) on node 102, and produces an output signal ($V_{OUT}$) on nodes 204 and 206. Voltage controlled oscillator 200 also includes current source 260 to source a bias current $I_{BIAS}$ to the cross-coupled pair of bipolar junction transistors.

Voltage controlled oscillator 200 is referred to herein as a BJT VCO, in part because the cross-coupled transistors are BJT transistors. Further, VCO 100 (FIG. 1) is referred to herein as a "MOSFET VCO" in part because the cross-coupled transistors in VCO 100 are shown as MOSFET devices.

As stated above, the MOSFET VCO and the BJT VCO each rely on a tuned LC tank circuit to control the frequency of oscillation. The tuned LC tank circuit suffers from finite loss due in part to resistive losses in the inductor and varactors. Each type of VCO also includes a cross-coupled gain stage (also referred to as a "$g_m$ stage") to provide a "negative resistance" that overcomes the effect of the tank circuit loss. The gain stage is referred to as a $g_m$ stage in part because the negative resistance is provided by the transconductance $g_m$ of the cross-coupled transistors.

In general, the BJT has higher $g_m$ for a given current and is well suited for high frequency applications. Accordingly, a large percentage of high performance VCOs are implemented as BJT VCOs. MOSFETs generally have a lower $g_m$ and are better suited for lower frequency applications. Accordingly, MOSFET VCOs are generally used in lower frequency applications or in places where designers have no access to BJT technology.

Bias Current Considerations

Two different factors that may be considered to determine the bias level of a VCO circuit are the "startup condition" and the "amplitude condition." These factors are described below along with their application to BJT and MOSFET VCOs.

Startup Condition

One objective of the $g_m$ stages is to simulate a negative resistance to the tank elements that compensate for the tank loss. In some embodiments, the minimum $g_m$ of the transistor, ($g_{m\ min}$), may be set to approximately three times higher than the total loss ($g_{loss}$) of the tank elements:

$$g_{m\ min} = 3 g_{loss} \quad \text{(Eq. 1)}$$

Where $g_{loss}$ is equal to the reciprocal of the equivalent parallel resistance of the tank circuit. The 3× factor may be used to ensure that under process and temperature variations, the VCO circuit will always have a higher $g_m$ than the $g_{loss}$ factor. Factors other than three may also be used. If the VCO circuit has a higher $g_m$ than the $g_{loss}$, then the VCO will start to oscillate when power is applied. This is referred to herein as the condition for VCO startup.

Amplitude Condition

Given a fixed tank loss, increasing the VCO output signal amplitude reduces the phase noise of the VCO. The VCO signal amplitude ($V_{OUT}$) is directly proportional to the bias current:

$$V_{OUT} = I_{BIAS}/g_{loss} \quad \text{(Eq. 2)}$$

The manner in which $g_m$ depends on bias current differs between BJTs and MOSFETs. For a BJT, $g_m$ is directly proportional to the bias current:

$$g_{mBJT} = I_{BIAS}/V_t \quad \text{(Eq. 3)}$$

where $V_t$ is the thermal voltage. For a MOSFET, $g_m$ has a weaker dependency on $I_{BIAS}$:

$$g_{mMos} = \sqrt{K \cdot (W/L) \cdot I_{BIAS}} \quad \text{(Eq. 4)}$$

where W=the width of the transistor and L=the length of the transistor.

In general, the square root factor applies to long channel devices where $I_{BIAS}$ has a quadratic dependence on bias voltage. For short channel devices, this factor is even smaller translating to weaker current dependency. The transistor W/L sizing factor may be used to increase the $g_m$ of the device, however, increasing W/L increases the loading capacitance and hence restricts the VCO operating frequency.

Because of differences in the transistor types, a factor of approximately ten times higher $g_m$ can be achieved using a BJT circuit versus a reasonably sized MOSFET circuit. Since BJTs generally have a higher gain-bandwidth product ($f_t$) and a higher maximum frequency ($f_{max}$) than MOSFET transistors, their $g_m$ frequency degradation factor is much lower. This leads to an important observation in terms of what sets the bias current upper bound for BJT VCOs versus MOSFET VCOs. In general BJT VCOs are bias limited by the VCO voltage swing condition (Eq. 2) and not the $g_m$ startup condition (Eq. 1). Generally, BJT VCOs enjoy $g_m$ factors that are much higher than the required $g_{m\ min}$. On the other hand, the $g_m$ of MOSFET VCOs has weaker current dependency where both the bias current and W/L are optimized to obtain $g_{m\ min}$ while not degrading the operating frequency of the VCO.

Noise Considerations

Voltage controlled oscillators may be used in many different applications, including in receive and transmit paths of radio circuits to down-convert or up-convert a modulated signal, respectively. This operation is often referred to as "mixing" where in an ideal case the VCO is modeled as a pure single tone signal. In practice, however, the VCO signal power has a noise skirt in the frequency domain. The power in this noise skirt is referred to as phase noise. Phase noise may be quantified in many ways, but is generally quoted in terms of dBc/Hz (phase noise in dB relative to the carrier amplitude per unit Hz) or Noise/Signal (N/S) per Hz.

Phase noise is generally undesirable. Decreasing phase noise may be achieved by 1) reducing the noise contribution of the VCO elements and/or 2) increasing the signal level. Option 2 is directly related to increasing the VCO bias current which results in higher power usage. Further, even if higher power usage is acceptable, the noise level of the VCO is positively correlated with the bias current, which reduces the effectiveness of increasing the current/signal level.

The thermal noise of the $g_m$ transistors is a major limiting factor to the VCO phase noise. Thermal noise in a BJT is significantly different than in a MOSFET. For a BJT, thermal noise (shot noise) is directly proportional to current:

$$I_{cNoise}^2 = 2q \cdot I_{BIAS} \quad \text{(Eq. 5)}$$

For a MOSFET, thermal noise is directly proportional to $g_m$:

$$I_{dNoise}^2 = \gamma \cdot kT \cdot g_{mMOS} \quad \text{(Eq. 6)}$$

where γ is a correction factor with values between about 0.5 and 2.

Comparing equations 5 and 6 (and using equation 4 to calculate $g_{mMOS}$ versus $I_{BIAS}$), shows that thermal noise in a BJT is much higher than in a MOSFET at a given bias current.

Considering the fact that a high bias current for BJT was set to satisfy the voltage swing consideration (equation 2) and not the startup condition (equation 1), this leads to high BJT phase noise. Another observation to make is that the high bias current for the BJT VCO dictates a much higher $g_m$ factor than what is required for the VCO startup. On the other hand, a MOSFET VCO utilizes the minimum $g_m$ requirement for startup and enjoys a lower phase noise (equation 6).

As described above, BJT VCOs suffer from high phase noise due to the direct dependency of the thermal noise on bias current, and MOSFET VCOs have lower phase noise but suffer from low $g_m$ and $f_t/f_{max}$. Low $g_m$ and low $f_t/f_{max}$ in MOSFETs translates to using higher bias currents or limiting their use in high frequency applications.

Reducing Phase Noise

Figure 3:
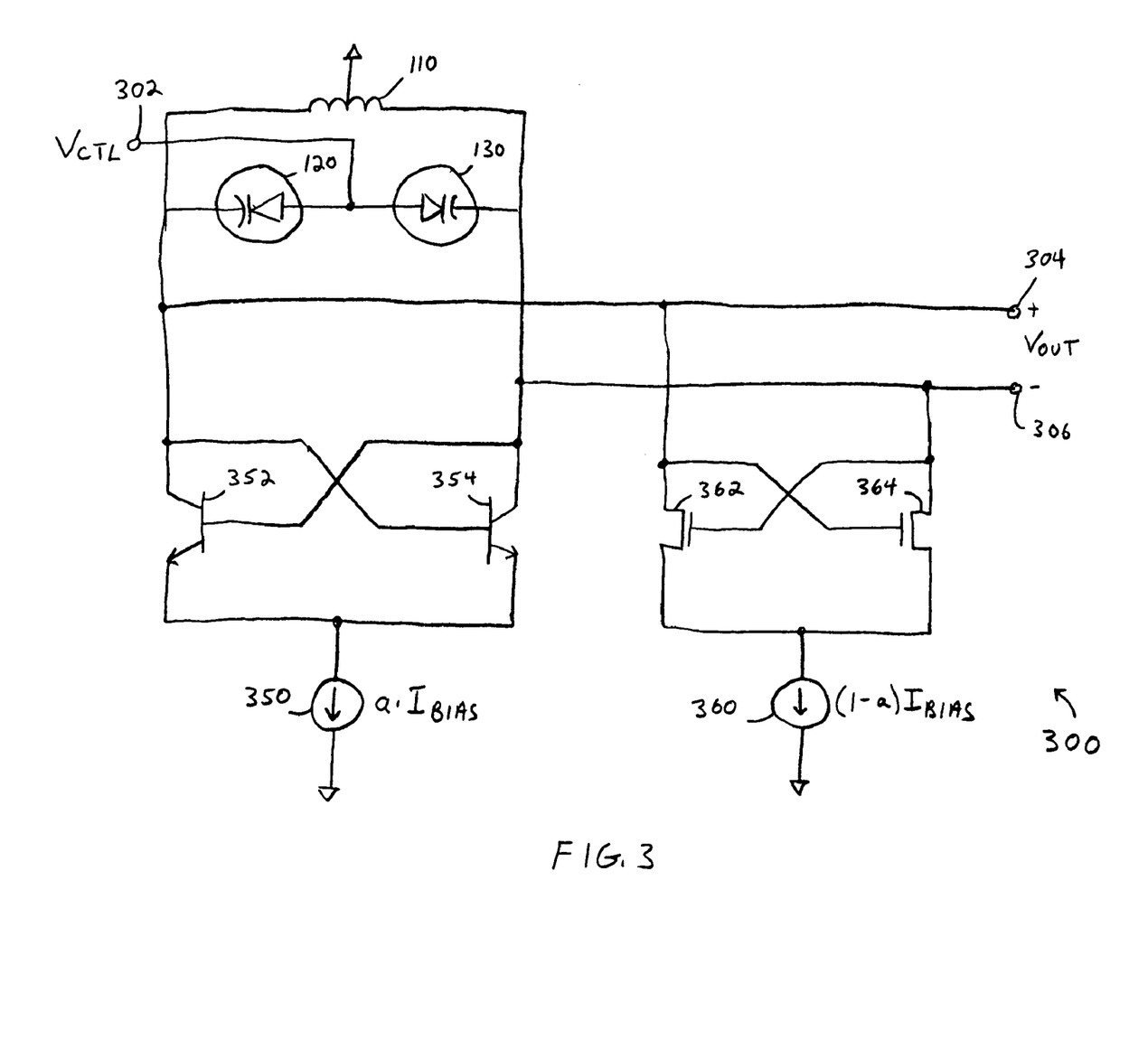
FIG. 3 shows a diagram of a voltage controlled oscillator having isolated gate transistors and bipolar junction transistors.

FIG. 3 shows a diagram of a voltage controlled oscillator having isolated gate transistors and bipolar junction transistors. Voltage controlled oscillator 300 includes the tank circuit shown in FIGS. 1 and 2, and also includes cross-coupled bipolar junction transistors 352 and 354, and cross-coupled isolated gate transistors 362 and 364. Cross-coupled isolated gate transistors 362 and 364 are shown as MOSFETs. The cross-coupled BJTs are coupled to current source 350 which provides a current (a·$I_{BIAS}$), and the cross-coupled MOSFETs are coupled to current source 360 which provides a current (1−a)($I_{BIAS}$). The tank circuit has a current of $I_{BIAS}$, which is equal to the sum of (a·$I_{BIAS}$) and (1−a)($I_{BIAS}$). The "a" factor may be chosen to divide the bias current between the two cross-coupled transistor pairs.

Voltage controlled oscillator 300 utilizes the strengths of both BJT and MOSFET transistors. By combining the cross-coupled BJTs with cross-coupled isolated gate transistors, the phase noise of the resulting VCO is reduced. The bias current provided by current source 350 is set high enough for cross-coupled transistors 352 and 354 to satisfy the startup condition. This draws on the strength of the BJT (higher $g_m$), but keeps the bias current through the BJTs no larger than necessary, thereby reducing the phase noise contribution of the BJTs. Any desired output voltage swing is then achieved by providing additional current using current source 360. The phase noise contribution by the MOSFETs is kept small in part because the W/L factor may be kept small.

In some embodiments, the MOSFET stage is used to pass the majority of the bias current and reduce the BJT bias current and the BJT noise contribution. Since the BJT stage is able to provide the required $g_{m\ min}$, in some embodiments the $g_m$ of the additional MOSFET stage is kept low by using the minimum W/L required to pass the remaining bias current. Hence, low noise is also obtained from this additional MOSFET stage as a result of having low $g_m$ (even with its high bias current). The small W/L for the MOSFET stage also reduces capacitive loading on the VCO tank circuit which reduces any shift in the oscillation frequency caused by capacitive loading.

When designing a VCO such as VCO 300, $I_{BIAS}$ and "a" may be determined using the startup condition and amplitude condition described above. For example, $I_{BIAS}$ may be set by the desired output voltage swing, also referred to as the "amplitude condition" (equation 2). Also for example, "a" may be selected such that the cross-coupled BJT transistors will pass the minimum required current to provide the startup $g_{m\ min}$. In some embodiments, this current may be approximately 1/10th of the total bias current. This results in a lower thermal noise contribution made by the cross-coupled BJTs (equation 5). In some embodiments, "a" may be increased beyond the point at which the minimum current required for startup is provided. For example, "a" may be increased to ensure that the startup condition is met over voltage and process variations.

The cross-coupled MOSFET transistors will pass the remaining bias current $(1-a)(I_{BIAS})$. The W/L sizing of the MOSFET transistors may be set to a much lower value since the MOSFETs are used to switch the remaining bias current to the tank, and not to provide the $g_m$ for the VCO. This may also translate to a much lower thermal noise for the MOSFET devices (equation 6).

The isolated gate transistors shown in FIG. 3 are shown as N-type metal oxide semiconductor field effect transistors (NMOSFETs), and the bipolar junction transistors are shown as NPN transistors. In some embodiments, P-type MOSFETS and PNP BJTs are utilized. In still further embodiments, other types of switching or amplifying elements may be utilized for the various transistors described herein, without departing from the scope of the present invention.

The circuits described herein may be manufactured in many different ways. For example, in some embodiments, VCO 300 is manufactured in a silicon germanium (SiGe) process.

Figure 4:
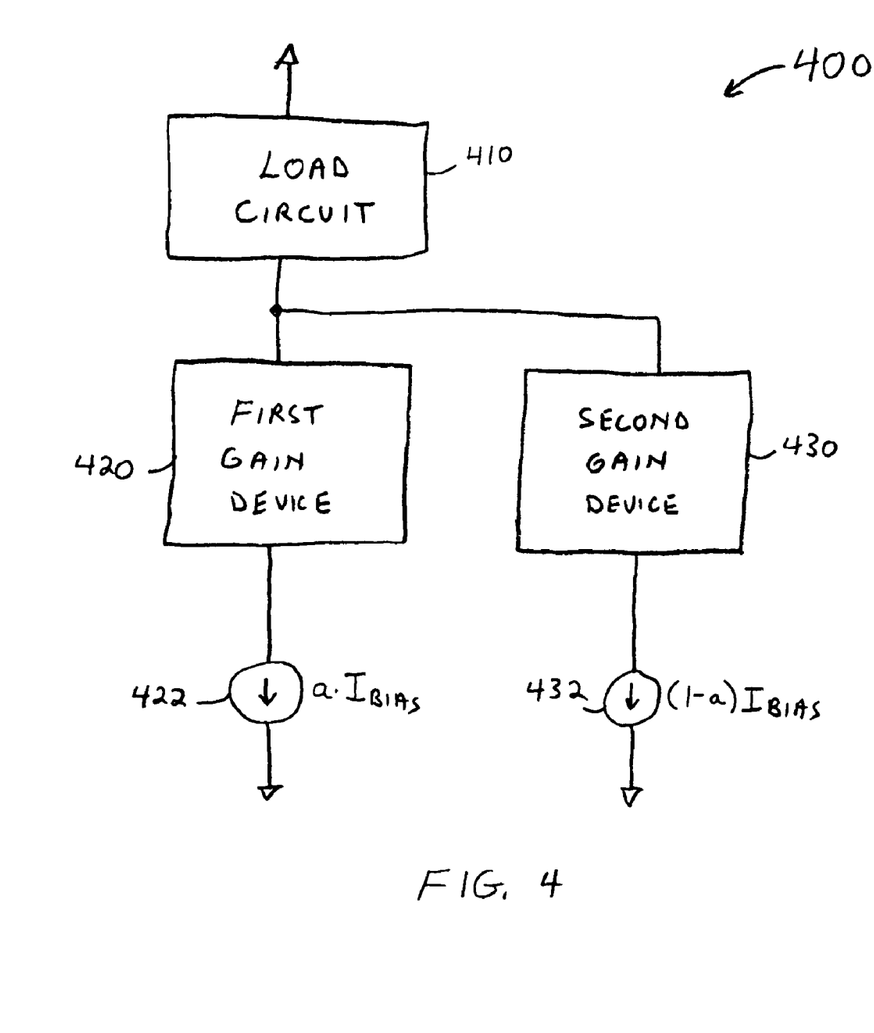
FIG. 4 shows a diagram of a circuit having gain devices with separate current sources.

FIG. 4 shows a diagram of a circuit having gain devices with separate current sources. In some embodiments, circuit 400 represents a generalization of VCO 300 (FIG. 3). Circuit 400 includes load circuit 410, first gain device 420, current source 422, second gain device 430, and current source 432. Load circuit 410 has a bias current $I_{BIAS}$ passing through it, which is divided between first and second gain devices, 420 and 430, respectively. Current source 422 provides a bias current $(a \cdot I_{BIAS})$, and current source 432 provides a bias current $(1-a)(I_{BIAS})$.

Load circuit 410 may be any type of circuit that provides a load to the gain devices. Examples include, but are not limited to, active loads, tank circuits, or the like. In some embodiments, load circuit 410 includes a tank circuit that includes inductors and variable capacitors. One example embodiment of load circuit 410 is shown in FIG. 3 having inductor 110 and varactors 120 and 130.

First gain device 420 and second gain device 430 may have different characteristics. By utilizing separate gain stages with different characteristics, phase noise may be reduced. For example, first gain device 420 may have a higher transconductance than second gain device 430. Also for example, first gain device 420 may have exhibit a phase noise characteristic that shows a greater dependency on bias current than second gain device 430. By splitting the bias current between first gain device 420 and second gain device 430, a desired amount of gain may be achieved using a desired amount of bias current, while reducing phase noise.

In some embodiments, first gain device 420 includes cross-coupled bipolar junction transistors, and in some embodiments, second gain device 420 includes cross-coupled isolated gate transistors. Many different embodiments may exist having different combinations of gain element types.

In some embodiments, circuit 400 implements a voltage controlled oscillator. In other embodiments, circuit 400 represents an oscillator having a substantially fixed output frequency. In general, circuit 400 may be any circuit with multiple gain devices that have different characteristics.

Figure 5:
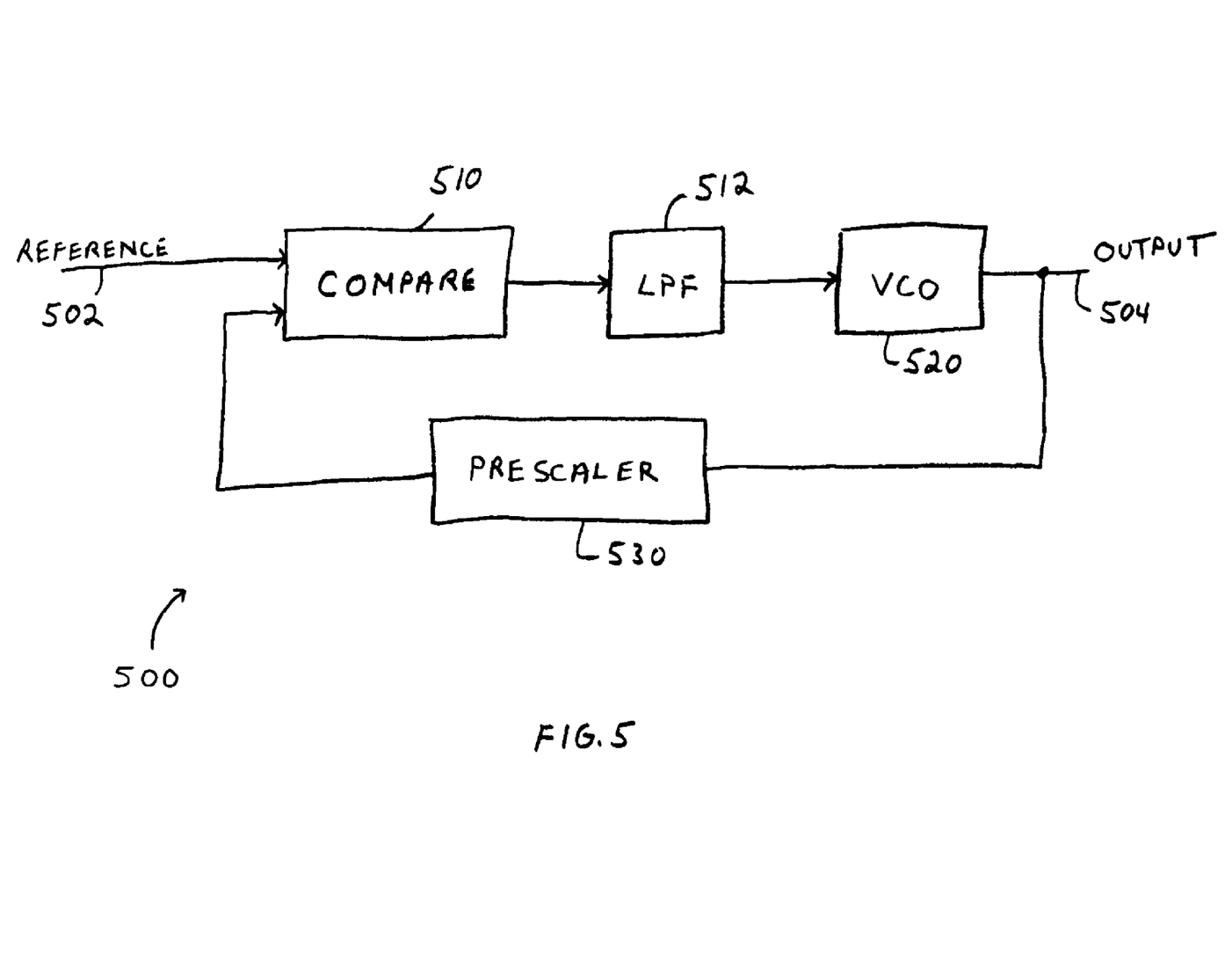
FIG. 5 shows a diagram of a frequency synthesizer.

FIG. 5 shows a diagram of a frequency synthesizer. Frequency synthesizer 500 includes VCO 520, frequency prescaler 530, low pass filter (LPF) 512, and compare circuit 510. In operation, compare circuit 510 receives a reference signal on node 502, and an output signal from frequency prescaler 530. Compare circuit 510 may compare phases of the two signals or frequency of the two signals and produce an error signal. The error signal is received by LPF 512 which produces a VCO control signal. VCO 520 receives the VCO control signal from LPF 512, and produces an output signal on node 504.

Voltage controlled oscillator 520 may produce an output signal that is greater in frequency than the reference signal on node 502 in part because prescaler 530 divides the frequency of the output signal on node 504. Voltage controlled oscillator 520 may be any of the VCO embodiments described herein, including one of the embodiments represented by VCO 300 (FIG. 3) or circuit 400 (FIG. 4). Prescaler 530 may be any type of suitable prescaler, including a prescaler capable of dividing the frequency of the VCO output signal by a variable amount.

Figure 6:
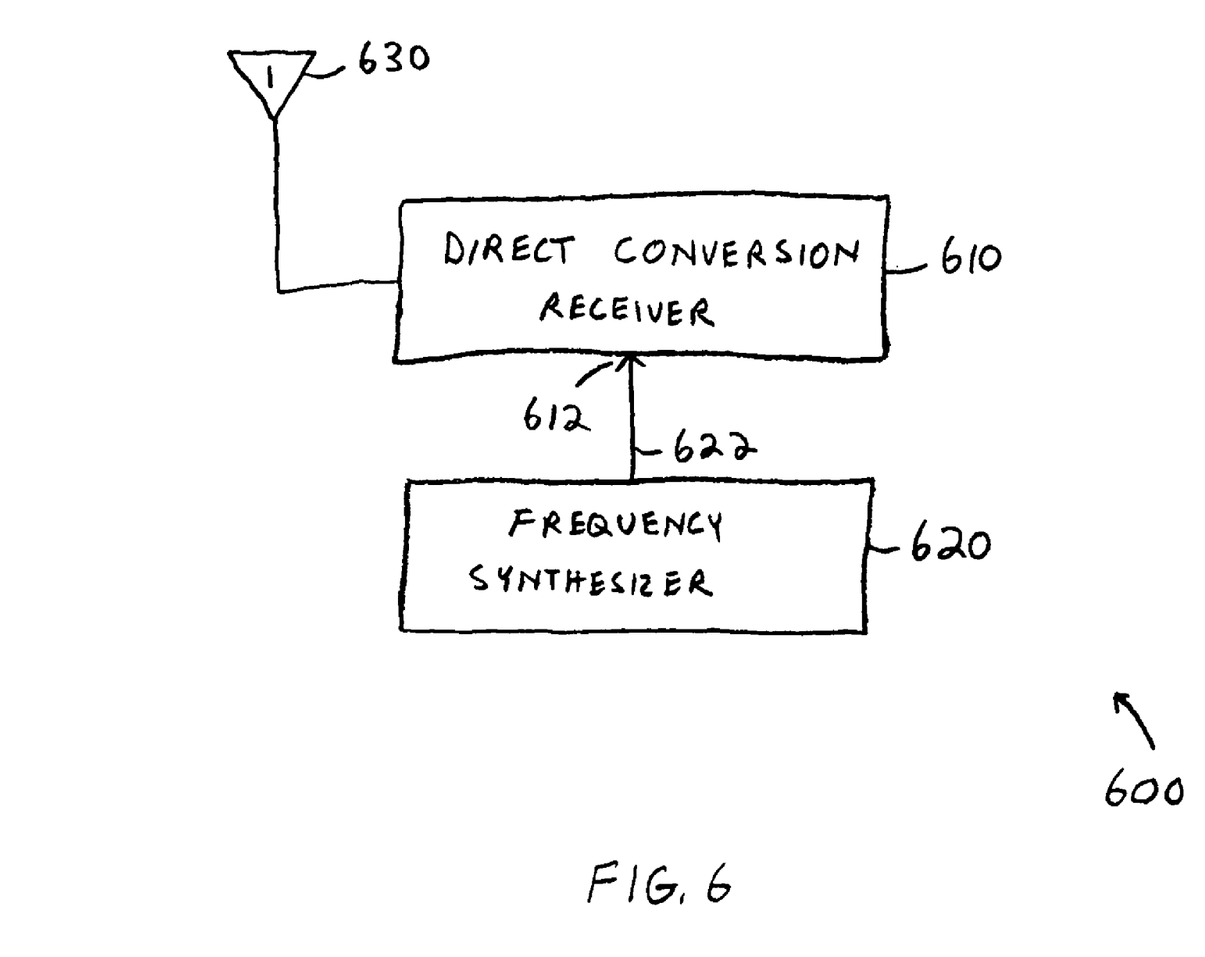
FIG. 6 shows a system diagram in accordance with various embodiments of the present invention.

FIG. 6 shows a system diagram in accordance with various embodiments of the present invention. System 600 includes frequency synthesizer 620, direct conversion receiver 610, and antenna 630. Frequency synthesizer 620 may include any of the VCO embodiments described above. Further, frequency synthesizer 620 may be implemented using a circuit topology similar to that shown in FIG. 5.

Frequency synthesizer 620 may provide a local oscillator signal on node 622, and direct conversion receiver 610 may receive a local oscillator signal at oscillator input port 612. Direct conversion receiver 610 may also receive a signal from antenna 630. Direct conversion receiver 610 may utilize the local oscillator signal to "down-convert" the signal received from antenna 630 directly to baseband. Because direct conversion receiver 610 does not utilize an intermediate frequency (IF), it may also be referred to as a "zero-IF" receiver.

In some embodiments, system 600 includes a transceiver that both transmits and receives signals at antenna 630. For example, system 600 may be a cell phone with a transmitter and a receiver. Also for example, system 600 may be a wireless local area network interface that includes both a transmitter and a receiver. In some embodiments, antenna 630 may be a directional antenna, and in other embodiments, antenna 630 may be an omni-directional antenna.

Frequency synthesizers (and VCOs) may be used in systems other than systems represented by FIG. 6. For example, a frequency synthesizer may be used in a system that includes a heterodyne receiver that utilizes an intermediate frequency. Many other system uses exist for frequency synthesizers and VCOs.

Voltage controlled oscillators, frequency synthesizers, cross-coupled transistors, and other embodiments of the present invention can be implemented in many ways. In some embodiments, they are implemented in integrated circuits as part of electronic systems. In some embodiments, design descriptions of the various embodiments of the present invention are included in libraries that enable designers to include them in custom or semi-custom designs. For example, any of the disclosed embodiments can be implemented in a synthesizable hardware design language, such as VHDL or Verilog, and distributed to designers for inclusion in standard cell designs, gate arrays, or the like. Likewise, any embodiment of the present invention can also be represented as a hard macro targeted to a specific manufacturing process. For example, portions of VCO 300 (FIG. 3) may be represented as polygons assigned to layers of an integrated circuit.

Figure 7:
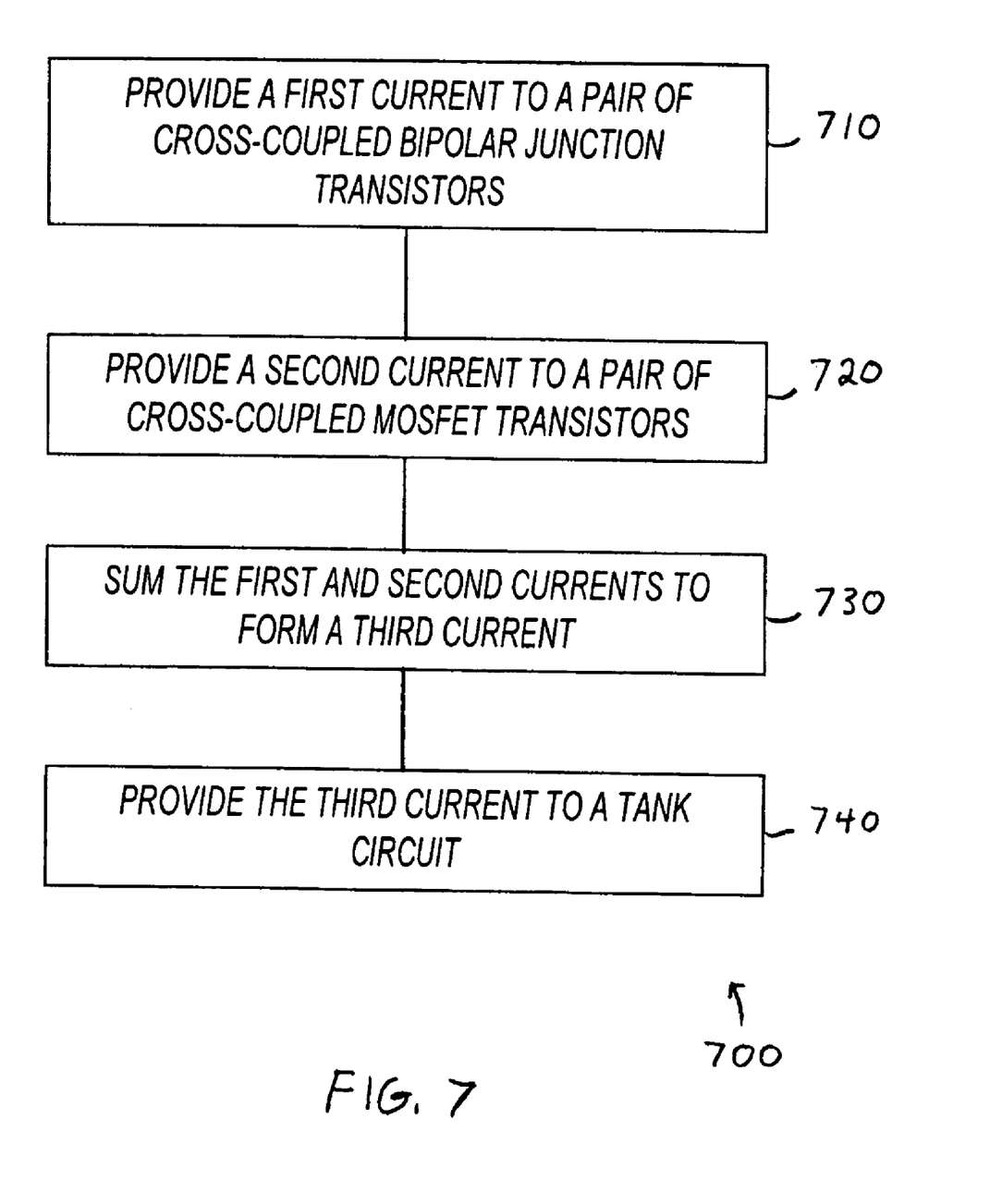
FIG. 7 shows a flowchart in accordance with various embodiments of the present invention.

FIG. 7 shows a flowchart in accordance with various embodiments of the present invention. In some embodiments, method 700, or portions thereof, is performed by a voltage controlled oscillator, embodiments of which are shown in previous figures. In other embodiments, method 700 is performed by a frequency synthesizer, an integrated circuit, or an electronic system. Method 700 is not limited by the particular type of apparatus performing the method. The various actions in method 700 may be performed in the order presented, or may be performed in a different order. Further, in some embodiments, some actions listed in FIG. 7 are omitted from method 700.

Method 700 is shown beginning with block 710 in which a first current is provided to a pair of cross-coupled bipolar junction transistors. In some embodiments, this corresponds to the operation of current source 350 (FIG. 3). The magnitude of the first current may be large or small, and may be adequate to satisfy a VCO startup condition. Further, the magnitude of the first current may be inadequate to satisfy an amplitude condition. For example, in some embodiments, the first current is just large enough to allow the transconductance of the bipolar junction transistors to overcome the loss of a tank circuit. For example, referring now back to FIG. 3, current source 350 sources a current of (a·$I_{BIAS}$), where $I_{BIAS}$ is the total bias current through the tank circuit, and the "a" multiplier represents the fraction of the total bias current that passes through the cross-coupled bipolar junction transistors. In embodiments represented by FIG. 3, this fraction of the total bias current is equal to the first current referred to in 710.

At 720, a second current is provided to a pair of cross-coupled MOSFET transistors. In some embodiments, this corresponds to the operation of current source 360 (FIG. 3). The magnitude of the second current may be large or small, but in some embodiments, the magnitude of the second current is set to provide a desired output amplitude swing on nodes 304 and 306 (FIG. 3). In some embodiments, the "a" multiplier in FIG. 3 is set to about $1/10$. In these embodiments, $1/10$ of the total bias current is provided to the pair of cross-coupled bipolar junction transistors, and $9/10$ of the total bias current is provided to the pair of cross-coupled MOSFET transistors.

At 730, the first and second currents are summed to form a third current, and at 740, the third current is provided to a tank circuit. This corresponds to the currents through the cross-coupled bipolar junction transistors and the cross-coupled MOSFET transistors sum ming to form the total bias current which passes through the tank circuit as shown in FIG. 3.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. A voltage controlled oscillator comprising:
   a tank circuit;
   a first pair of cross-coupled transistors to receive a first current from the tank circuit; and
   a second pair of cross-coupled transistors to receive a second current from the tank circuit, wherein the first and second currents are unequal, and wherein the first pair of cross-coupled transistors comprises bipolar junction transistors, and the second pair of cross-coupled transistors comprises isolated gate transistors.

2. The voltage controlled oscillator of claim 1 wherein the second current is greater than the first current.

3. The voltage controlled oscillator of claim 1 wherein the first current is large enough for the cross-coupled pair of bipolar junction transistors to satisfy a startup condition of the voltage controlled oscillator.

4. The voltage controlled oscillator of claim 1 wherein the first and second pairs of cross-coupled transistors are manufactured in a SiGe process.

5. A voltage controlled oscillator comprising:
   a tank circuit;
   a first pair of cross-coupled transistors to receive a first current from the tank circuit; and
   a second pair of cross-coupled transistors to receive a second current from the tank circuit, wherein the first and second currents are unequal, and wherein the first pair of cross-coupled transistors exhibits a phase noise substantially proportional to current, and the second pair of cross-coupled transistors exhibits a phase noise substantially proportional to transconductance.

6. The voltage controlled oscillator of claim 5 wherein the second current is larger than the first current.

7. The voltage controlled oscillator of claim 5 wherein the second pair of cross-coupled transistors comprises field effect transistors (FETs).

8. An apparatus comprising:
   a first gain device having a first transconductance value;
   a first current source to provide a first current to the first gain device;
   a second gain device having a second transconductance value lower than the first transconductance value;
   a second current source to provide a second current to the second gain device, the second current being larger than the first current; and
   a load circuit coupled to the first and second gain devices;
   wherein the first gain device comprises a cross-coupled pair of bipolar junction transistors and the second gain device comprises a cross-coupled pair of isolated gate transistors.

9. The apparatus of claim 8 wherein the load circuit comprises a tank circuit.

10. An apparatus comprising:
a first gain device having a first transconductance value;
a first current source to provide a first current to the first gain device;
a second gain device having a second transconductance value lower than the first transconductance value;
a second current source to provide a second current to the second gain device, the second current being larger than the first current; and
a load circuit coupled to the first and second gain devices;
wherein the first gain device exhibits a phase noise substantially proportional to the first current and the second gain device exhibits a phase noise substantially proportional to the second transconductance.

11. A frequency synthesizer comprising:
a comparison circuit to compare a reference signal and a frequency divided signal;
a prescaler to divide a frequency of an output signal and produce the frequency divided signal; and
a voltage controlled oscillator to synthesize the output signal in response to the comparison circuit, the voltage controlled oscillator including a cross-coupled pair of bipolar junction transistors and a cross-coupled pair of isolated gate transistors coupled to a tank circuit.

12. The frequency synthesizer of claim 11 wherein the voltage controlled oscillator further includes a first current source coupled to the cross-coupled pair of bipolar junction transistors to provide a first current, and a second current source coupled to the cross-coupled pair of isolated gate transistors to provide a second current.

13. The frequency synthesizer of claim 12 wherein the second current is larger than the first current.

14. The frequency synthesizer of claim 12 wherein the first current is sized to satisfy a startup condition of the voltage controlled oscillator.

15. The frequency synthesizer of claim 14 wherein the second current is sized so a sum of the first and second currents satisfy an output voltage condition.

16. An electronic system that includes a direct conversion receiver with an oscillator input port, a directional antenna coupled to the direct conversion receiver, and a frequency synthesizer coupled to the oscillator input port, the frequency synthesizer comprising:
a comparison circuit to compare a reference signal and a frequency divided signal;
a prescaler to divide a frequency of an output signal and produce the frequency divided signal; and
a voltage controlled oscillator to synthesize the output signal in response to the comparison circuit, the voltage controlled oscillator including a cross-coupled pair of bipolar junction transistors and a cross-coupled pair of isolated gate transistors coupled to a tank circuit.

17. The electronic system of claim 16 wherein the voltage controlled oscillator further includes a first current source coupled to the cross-coupled pair of bipolar junction transistors to provide a first current, and a second current source coupled to the cross-coupled pair of isolated gate transistors to provide a second current.

18. The electronic system of claim 17 wherein the second current is larger than the first current.

19. The electronic system of claim 17 wherein the first current is sized to satisfy a startup condition of the voltage controlled oscillator.

20. The electronic system of claim 19 wherein the second current is sized so a sum of the first and second currents satisfy an output voltage condition.

21. A method comprising:
providing a first current to a pair of cross-coupled bipolar junction transistors;
providing a second current a pair of cross-coupled metal oxide semiconductor field effect transistors;
summing the first and second currents to form a third current; and
providing the third current to a tank circuit.

22. The method of claim 21 wherein providing a first current comprises providing an adequate current to satisfy a startup condition.

23. The method of claim 22 wherein the first current is inadequate to satisfy an output amplitude condition.

24. The method of claim 23 wherein providing a second current comprises providing an adequate current for the third current to satisfy the output amplitude condition.

25. The apparatus of claim 8 wherein the second gain device comprises a pair of cross-coupled field effect transistors (FETs).

26. The apparatus of claim 10 wherein the first gain device comprises a pair of cross-coupled bipolar junction transistors (BJTs).

27. The apparatus of claim 10 wherein the second gain device comprises a pair of cross-coupled field effect transistors (FETs).

* * * * *